US010428426B2

(12) United States Patent
Raj et al.

(10) Patent No.: US 10,428,426 B2
(45) Date of Patent: Oct. 1, 2019

(54) METHOD AND APPARATUS TO PREVENT DEPOSITION RATE/THICKNESS DRIFT, REDUCE PARTICLE DEFECTS AND INCREASE REMOTE PLASMA SYSTEM LIFETIME

(71) Applicant: Applied Materials, Inc., Santa Clara, CA (US)

(72) Inventors: Daemian Raj, Fremont, CA (US); Ying Ma, Castro Valley, CA (US); DongQing Li, Fremont, CA (US); Jay D. Pinson, II, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 356 days.

(21) Appl. No.: 15/494,186

(22) Filed: Apr. 21, 2017

(65) Prior Publication Data
US 2017/0306493 A1 Oct. 26, 2017

Related U.S. Application Data

(60) Provisional application No. 62/326,372, filed on Apr. 22, 2016.

(51) Int. Cl.
| | | |
|---|---|---|
| C23C 16/40 | (2006.01) | |
| C23C 16/50 | (2006.01) | |
| C23C 16/44 | (2006.01) | |
| C23C 16/455 | (2006.01) | |
| H01J 37/32 | (2006.01) | |
| C23C 16/452 | (2006.01) | |
| C23C 16/54 | (2006.01) | |

(52) U.S. Cl.
CPC ........ *C23C 16/50* (2013.01); *C23C 16/4401* (2013.01); *C23C 16/4405* (2013.01); *C23C 16/4408* (2013.01); *C23C 16/452* (2013.01); *C23C 16/45561* (2013.01); *C23C 16/45565* (2013.01); *C23C 16/45574* (2013.01); *C23C 16/54* (2013.01); *H01J 37/32449* (2013.01); *H01J 37/32899* (2013.01)

(58) Field of Classification Search
USPC .......... 118/719, 723 MW, 723 ME, 723 MR, 118/723 MA, 723 ER, 723 IR; 156/345.31, 345.32
See application file for complete search history.

(56) References Cited

U.S. PATENT DOCUMENTS

| | | | | |
|---|---|---|---|---|
| 4,482,419 A | * | 11/1984 | Tsukada | H01J 37/16 156/345.31 |
| 5,134,965 A | * | 8/1992 | Tokuda | C23C 16/45502 118/715 |
| 5,788,778 A | * | 8/1998 | Shang | B08B 7/0035 134/1 |

(Continued)

FOREIGN PATENT DOCUMENTS

JP 2015079964 A * 4/2015 ....... H01L 21/67069

*Primary Examiner* — Rudy Zervigon
(74) *Attorney, Agent, or Firm* — Patterson + Sheridan LLP

(57) ABSTRACT

A method and apparatus for a deposition chamber is provided and includes a twin chamber that includes a first remote plasma system coupled and dedicated to a first processing region, a second remote plasma system coupled and dedicated to a second processing region, and a third remote plasma system shared by the first processing region and the second processing region.

20 Claims, 3 Drawing Sheets

(56) References Cited

U.S. PATENT DOCUMENTS

| | | | |
|---|---|---|---|
| 5,855,681 A * | 1/1999 | Maydan | H01L 21/67167 118/719 |
| 6,055,927 A * | 5/2000 | Shang | C23C 16/4405 118/723 ME |
| 6,182,603 B1 * | 2/2001 | Shang | C23C 16/4404 118/715 |
| 6,432,255 B1 * | 8/2002 | Sun | H01L 21/67063 118/723 E |
| 6,843,881 B2 * | 1/2005 | Kim | B08B 7/0035 134/56 R |
| 6,962,644 B2 * | 11/2005 | Paterson | H01J 37/32082 118/719 |
| 7,430,984 B2 * | 10/2008 | Hanawa | H01J 37/32082 118/723 AN |
| 7,628,863 B2 * | 12/2009 | Sen | H01L 21/67103 118/715 |
| 7,862,683 B2 * | 1/2011 | Fukiage | C23C 16/4405 118/715 |
| 8,197,636 B2 * | 6/2012 | Shah | H01J 37/32366 118/719 |
| 8,617,347 B2 | 12/2013 | Kim et al. | |
| 9,502,218 B2 * | 11/2016 | Chen | H01J 37/32422 |
| 2002/0073925 A1 * | 6/2002 | Noble | C23C 8/36 118/723 ME |
| 2003/0029833 A1 * | 2/2003 | Johnson | H01L 21/67161 216/58 |
| 2003/0047449 A1 * | 3/2003 | Hanawa | H01J 37/32082 204/298.06 |
| 2003/0213560 A1 * | 11/2003 | Wang | C23C 14/566 156/345.31 |
| 2005/0205210 A1 * | 9/2005 | Devine | C23C 16/45557 156/345.32 |
| 2010/0012273 A1 * | 1/2010 | Sankarakrishnan | B08B 5/00 156/345.29 |
| 2010/0098882 A1 | 4/2010 | Lubomirsky et al. | |
| 2011/0265831 A1 * | 11/2011 | Lee | H01J 37/3244 134/30 |
| 2012/0090691 A1 * | 4/2012 | Baluja | C23C 16/4405 137/13 |
| 2013/0213574 A1 * | 8/2013 | Sankarakrishnan | B08B 5/00 156/345.31 |
| 2014/0374024 A1 * | 12/2014 | Nguyen | C23C 16/4405 156/345.31 |
| 2015/0155178 A1 * | 6/2015 | Kim | H01L 21/6719 438/710 |
| 2015/0211114 A1 * | 7/2015 | Kangude | C23C 16/4412 118/722 |
| 2015/0221479 A1 * | 8/2015 | Chen | H01J 37/32422 156/345.29 |
| 2015/0348755 A1 * | 12/2015 | Han | H01J 37/3244 118/723 IR |
| 2017/0062254 A1 * | 3/2017 | Hirochi | C23C 16/4412 |
| 2017/0294292 A1 * | 10/2017 | Hawrylchak | H01J 37/32357 |
| 2018/0230597 A1 * | 8/2018 | Ma | H01J 37/32357 |
| 2018/0258531 A1 * | 9/2018 | Ma | C23C 16/45565 |

* cited by examiner

METHOD AND APPARATUS TO PREVENT DEPOSITION RATE/THICKNESS DRIFT, REDUCE PARTICLE DEFECTS AND INCREASE REMOTE PLASMA SYSTEM LIFETIME

CROSS-REFERENCE TO RELATED APPLICATION

This application claims benefit of U.S. Provisional Patent Application Ser. No. 62/326,372, filed Apr. 22, 2016, which is hereby incorporated by reference herein.

BACKGROUND

Field

Embodiments disclosed herein generally relate to a semiconductor processing chamber and, more specifically, a deposition chamber and associated cleaning hardware and processes.

Description of the Related Art

Semiconductor processing involves a number of different chemical and physical processes enabling minute integrated circuits to be created on a substrate. Layers of materials, which make up the integrated circuit, are created by chemical vapor deposition, physical vapor deposition, epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

In the manufacture of integrated circuits, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

The processing chambers used in these processes typically include a remote plasma system (RPS) that remotely excites precursors and/or cleaning gases for introduction to the chamber. Conventionally, the same RPS is used for both of the precursor gases and the cleaning gases, and the plasma of both of the gases travel along the same flow path to the substrate. However, the RPS, as well as other components of the chamber, is made of aluminum, which is reactive with the cleaning gases (typically fluorine containing gases). Flowing the cleaning gases along the flow path causes particle formation due to the reaction of fluorine radicals with aluminum surfaces to form aluminum fluorides (i.e., one or more species of the genus of $AlF_X$). This, in turn, erodes portions of the RPS, particularly a plasma block of the RPS, and the $AlF_X$ on the chamber surfaces may consume precursor gases utilized in deposition, which leads to instability in deposition rates.

Therefore, what is needed is hardware configurations and related methods that minimize the challenges outlined above.

SUMMARY

A method and apparatus for a deposition chamber is provided and in one embodiment includes a twin chamber that includes a first remote plasma system coupled and dedicated to a first processing region, a second remote plasma system coupled and dedicated to a second processing region, and a third remote plasma system shared by the first processing region and the second processing region.

In another embodiment, a twin chamber system is provided that includes a first remote plasma chamber coupled to and dedicated to a first processing region of the twin chamber system, second remote plasma chamber coupled to and dedicated to a second processing region of the twin chamber system, and a third remote plasma chamber shared by the first processing region and the second processing region, wherein the first and second remote plasma chambers are dedicated to deposition precursors and the third remote plasma chamber is dedicated to cleaning precursors.

In another embodiment, a twin chamber system is provided that includes a pair of processing chambers, a first remote plasma system in selective fluid communication with a showerhead disposed within each of the processing chambers, the first remote plasma system comprising two remote plasma chambers that are dedicated to a respective one of the pair of processing chambers, and a second remote plasma system in selective fluid communication with a plasma distribution ring disposed in each of the pair of processing chambers, wherein the first remote plasma system is dedicated to delivering deposition precursors through the showerhead and the second remote plasma system is dedicated to delivering cleaning precursors through the respective plasma distribution rings.

BRIEF DESCRIPTION OF THE DRAWINGS

So that the manner in which the above-recited features of the present disclosure can be understood in detail, a more particular description, briefly summarized above, may be had by reference to embodiments, some of which are illustrated in the appended drawings. It is to be noted, however, that the appended drawings illustrate only typical embodiments and are therefore not to be considered limiting of its scope, for the embodiments disclosed herein may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure are illustratively described below in reference to plasma chambers, although embodiments described herein may be utilized in other chamber types and in multiple processes. In one embodiment, the plasma chamber is utilized in a plasma enhanced chemical vapor deposition (PECVD) system. Examples of PECVD systems that may be adapted to benefit from the disclosure include a PRODUCER® SE CVD system, a PRODUCER® GT™ CVD system or a DXZ® CVD system, all of which are commercially available from Applied Materials, Inc., Santa Clara, Calif. The Producer® SE CVD system chamber (e.g., 200 mm or 300 mm) has two isolated processing regions that may be used to deposit thin films on substrates, such as conductive films, oxide films such as silicon oxide films, carbon-doped silicon oxides and other materials. Although the exemplary embodiment includes two processing regions, it is contemplated that embodiments disclosed herein may be used to advantage in systems having a single processing region or more than two processing regions. It is also contemplated that embodiments disclosed herein may be utilized to advantage in other plasma chambers, including etch chambers, ion implantation chambers, plasma treatment chambers, and in resist stripping chambers, among others. It is further contemplated that embodiments disclosed herein may be utilized to advantage in plasma processing chambers available from other manufacturers.

Figure 1:
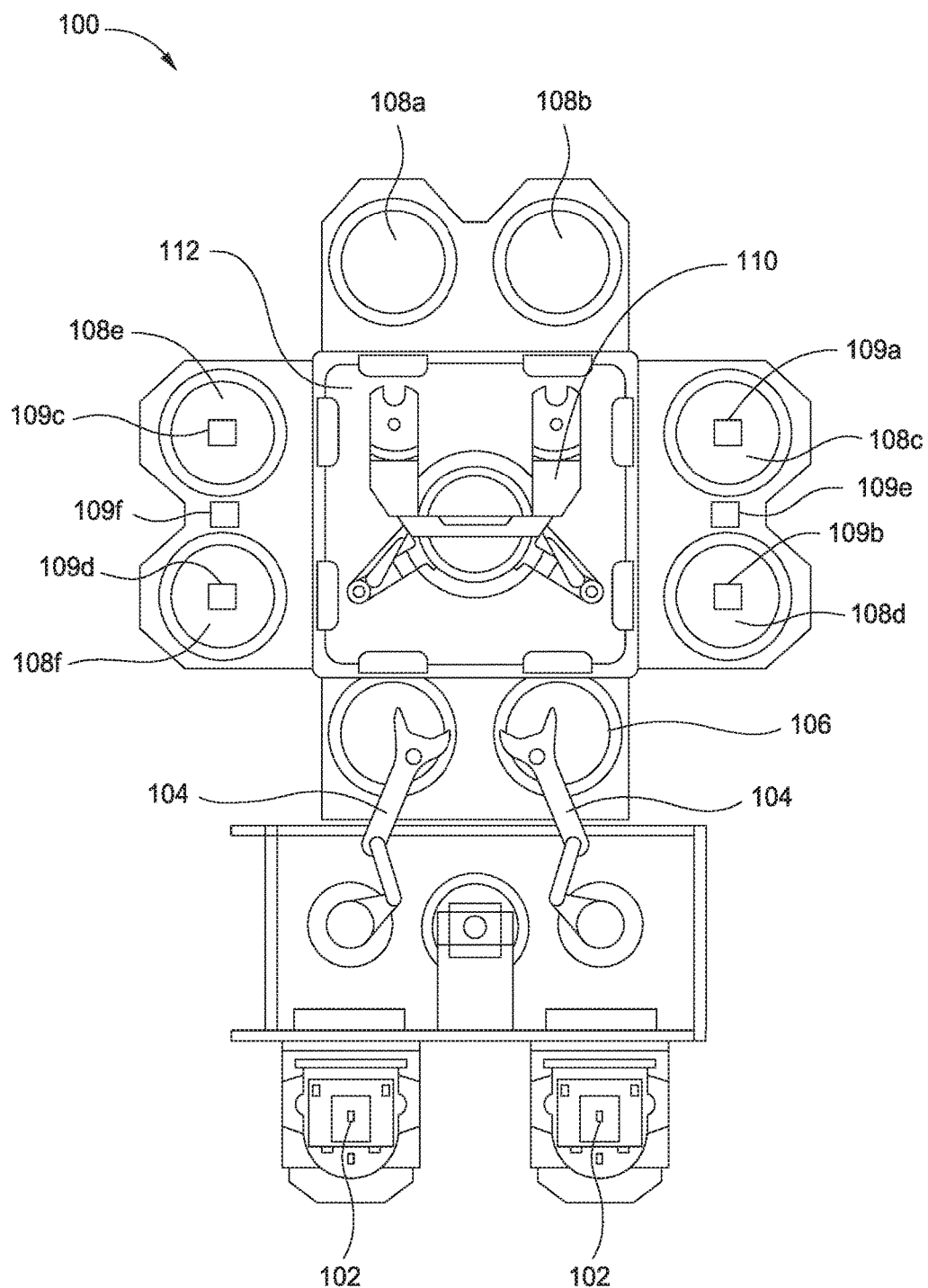
FIG. 1 is a schematic top plan view of a processing tool according to one implementation.

FIG. 1 is a schematic top plan view of a processing tool 100 according to one implementation. The processing tool 100, such as a cluster tool as shown in FIG. 1, includes a pair of front opening unified pods (FOUPs) 202 for supplying substrates, such as semiconductor wafers, that are received by robotic arms 104 and placed into load lock chambers 106. A second robotic arm 110 is disposed in a transfer chamber 112 coupled to the load lock chambers 106. The second robotic arm 110 is used to transport the substrates from the load lock chamber 106 to processing chambers 108a, processing chamber 108b, processing chamber 108c, processing chamber 108d, processing chamber 108e, and processing chamber 108f which are all coupled to the transfer chamber 112.

The processing chambers 108a-108f may include one or more system components for depositing, annealing, curing and/or etching a flowable film on the substrate. In one configuration, two pairs of the processing chambers (e.g., 108c-108d and 108e-108f) may be used to deposit the flowable film on the substrate, and the third pair of the processing chambers (e.g., 108a-108b) may be used to anneal/cure the deposited flowable film. In another configuration, the same two pairs of processing chambers (e.g., 108c-108d and 108e-108f) may be used to both deposit and anneal/cure the flowable film on the substrate, while the third pair of the processing chambers (e.g., 108a-108b) may be used to cure the flowable film on the substrate with ultraviolet (UV) or electron-beam (E-beam). The processing chambers used for depositing the flowable film on the substrate (e.g., 108c, 108d, 108e, 108f) may each include a first remote plasma system (RPS), for example RPS 109a, RPS 109b, RPS 109c, and RPS 109d which may be disposed on a lid of a respective processing chamber.

Each pair of processing chambers used for depositing the flowable film on the substrate (e.g., 108c-108d and 108e-108f) share a second RPS (e.g., RPS 109e and RPS 109f), which is disposed in between each pair of processing chambers. For example, the second RPS 109e is disposed between the processing chamber 108c and the processing chamber 108d, and the second RPS 109f is disposed between the processing chamber 108e and processing chamber 108f. In some implementations, each pair of processing chambers 108a-108b, 108c-108d, and 108e-108f is a single processing chamber including two substrate supports and capable of processing two substrates. In such implementations, each processing chamber includes two first RPS's, each disposed on the lid of the processing chamber over a corresponding substrate support, and one second RPS disposed on the lid of the processing chamber between the two first RPS's.

Each of the first RPS's 109a, 109b, 109c, and 109d is configured to excite a precursor gas, such as a silicon containing gas, an oxygen containing gas, and/or a nitrogen containing gas, to form precursor ions and/or radicals that form a flowable film on the substrate disposed in each of the processing chambers 108c, 108d, 108e, and 108f, respectively. Each of the second RPS's 109e and 109f is configured to excite a cleaning gas, such as a fluorine containing gas, to form cleaning ions and/or radicals that clean components of each pair of the processing chambers 108c-108d and 108e-108f, respectively.

Figure 2A:
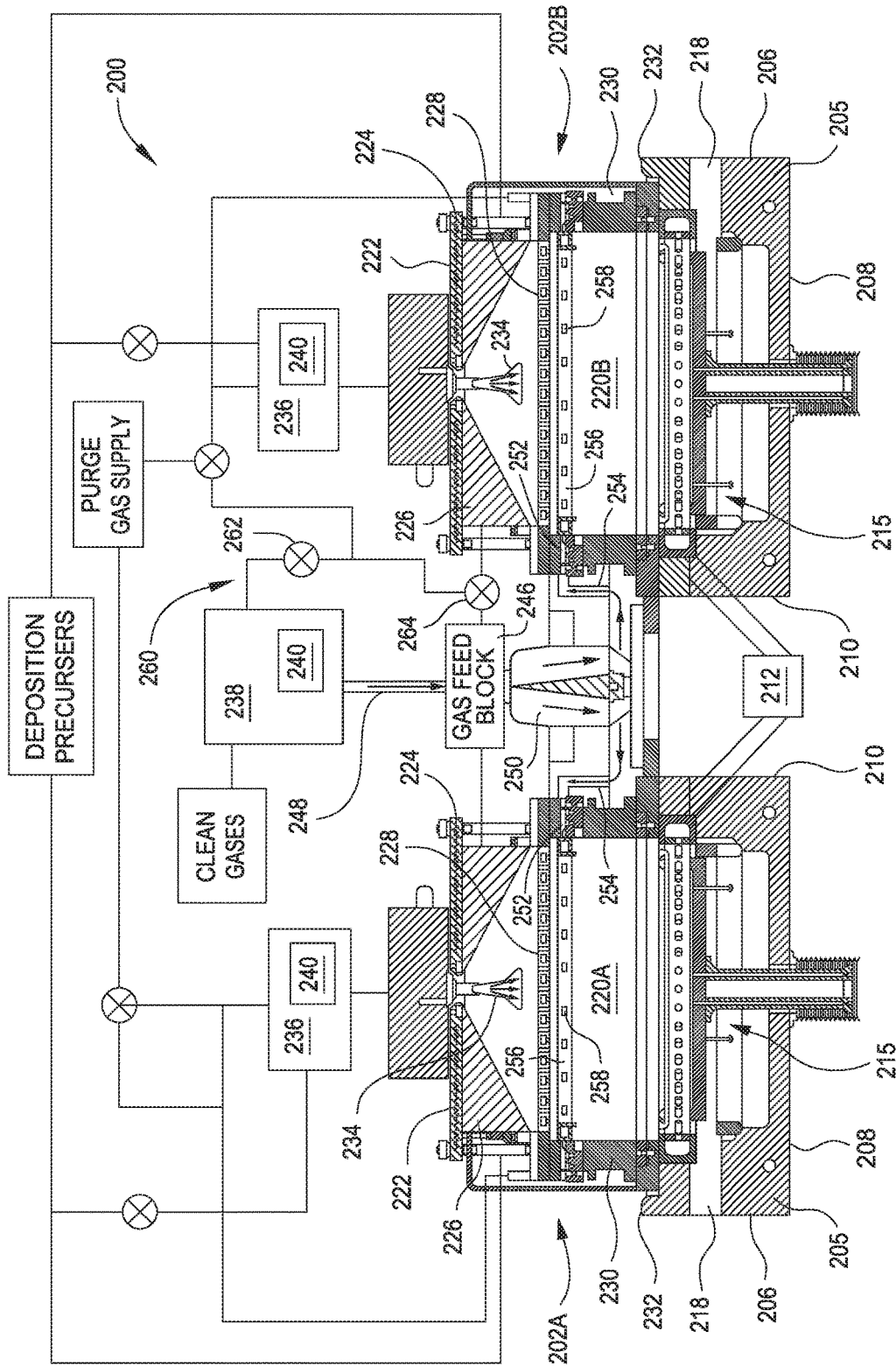
FIG. 2A is a schematic cross sectional view of a twin-chamber plasma system that may be used with the processing tool of FIG. 1.

FIG. 2A is a schematic cross sectional view of a twin-chamber plasma system 200. The plasma system 200 generally comprises two processing chambers similar to any of the processing chambers 108c and 108d, or processing chambers 108e and 108f as shown in FIG. 1. The processing chambers shown in FIG. 2A are denoted as a first processing chamber 202A and a second processing chamber 202B. Each of the first processing chamber 202A and the second processing chamber 202B comprise a processing chamber body 205 having sidewalls 206, a bottom wall 208 and a shared interior sidewall 210 defining a pair of processing regions 220A and 220B. Each of the processing regions 220A, 220B may be similarly configured. A vacuum pump 212 may be coupled to and shared by each of the processing regions 220A and 220B.

A pedestal 215 is disposed in each of the processing regions 220A and 220B through a respective passage formed in the bottom wall 208 of the processing chamber body 205. The pedestal 215 is adapted to support a substrate (not shown) on the upper surface thereof. The pedestal 215 may include thermal control elements, for example a cooling channel, to control the temperature of the pedestal 215 as well as substrate temperature, as desired. The temperature of the pedestal 215 may be controlled to about room temperature of slightly greater than room temperature, such as about 80 degrees Celsius.

Each pedestal 215 may include substrate lift pins (not shown) disposed through a body of the pedestal 215. The substrate lift pins selectively space the substrate from the pedestal to facilitate exchange of the substrate with a robot (not shown) utilized for transferring the substrate into and out of the processing regions 220A, 220B through a substrate transfer port 218.

A heater plate 222, which may function as a chamber lid having a heating element 224, is coupled to a top portion of the chamber body 205. A dome structure 226 may be positioned below the heater plate 222. The heater plate 222 may be utilized to control the temperature of at least the upper portions of the processing chamber body 205, such as the dome structure 226. The temperature of the dome structure 226 may be maintained at about 130 degrees Celsius according to some embodiments. A dual channel showerhead 228 may be coupled below the dome structure 226, and a plasma ring/spacer 230 may be positioned below the dual channel showerhead 228. A lid plate 232 may be positioned between the plasma ring/spacer 230 and the processing chamber body 205. Additionally, each of the processing regions 220A, 220B may include a baffle 234 where disassociated gases may enter the processing chamber body 205.

Each of the heater plate 222, the dome structure 226, the dual channel showerhead 228, the plasma ring/spacer 230, and the baffle 234 are made of aluminum and have surfaces that are in communication with the processing regions 220A and 220B. These surfaces include anodized and non-anodized surfaces that adsorb deposition precursors in a plasma, and are also reactive with cleaning gases, such that $AlF_X$ formation and/or etching of the surfaces may occur.

Each of the processing regions 220A, 220B have a dedicated remote plasma system for deposition of precursors, for example a first RPS 236 (two remote plasma generators) for deposition gases (one for each of the processing regions 220A, 220B) and a second RPS 238 for cleaning gases shared by both of the processing regions 220A, 220B. The second RPS 238 may be a single remote plasma chamber that is shared by both of the first processing chamber 202A and the second processing chamber 202B, as shown. The first RPS 236 and the second RPS 238 include a plasma block 240 where gases are contained and excited into a plasma that is subsequently flowed to the processing regions 220A and/or 220B. A gas feed block 246 may be disposed centrally relative to the first processing chamber 202A and the second processing chamber 202B, and is coupled to the second RPS 238 via a conduit 248 (typically made of aluminum). Deposition precursors that are disassociated into radicals by the first RPS 236 include nitrogen containing gases (e.g., ammonia ($NH_3$)), silanes (e.g., trisilylamine), oxygen, as well as inert gases (e.g., argon (Ar), helium). Cleaning gases that are disassociated into radicals by the second RPS 238 include fluorine containing gases, such as $NF_3$, as well as oxygen ($O_2$) and inert gases.

In some embodiments, plasma from the second RPS 238 flows through the conduit 248 and the gas feed block 246 into a splitter 250. The splitter 250 channels the cleaning plasma into an inlet 252 of the plasma ring/spacer 230 via conduits 254 disposed therebetween. The plasma ring/spacer 230 includes a plasma distribution ring 256 that is in fluid communication with the processing regions 220A, 220B. The plasma distribution ring 256 includes a plurality of openings 258 where the plasma of cleaning gases can flow into the processing regions 220A, 220B below the dual channel showerhead 228.

During deposition, an argon purge may be flowed through a bypass system 260 to prevent deposition gas radicals from being lost into the volume inside the plasma ring/spacer 230, the first RPS 236 as well as the conduits associated with the first RPS 236. The Ar-purge through the plasma ring/spacer 230 during deposition may be bypassing the second RPS 238 to prevent transporting any potential AlF residue within the second RPS 238 (since it is dedicated for disassociating $NF_3$ to F-radicals) into the chamber and onto the substrate during deposition. This effectively resolves AlF defects on-substrate.

In some embodiments, a valve 262 may be closed during the deposition cycle while a valve 264 is open. The flow of purge gases during deposition may be through the plasma ring/spacer 230. However, the valve 262 may be open during the clean cycle while the valve 264 is closed. The purge lines on the sides of the system of FIG. 2A may be used to flow a purge gas to the first RPS's 236 during the clean cycle to prevent back diffusion into the first RPS's 236 during the clean cycle. The flow rate of the purge gas during the clean cycle may be about 1.5 liters per minute (for each processing region 220A-B) while the flow rate of the purge gas during deposition may be about 250 standard cubic centimeters per minute (sccm), for example 125 sccm for each of the processing regions 220A and 220B.

Figure 2B:
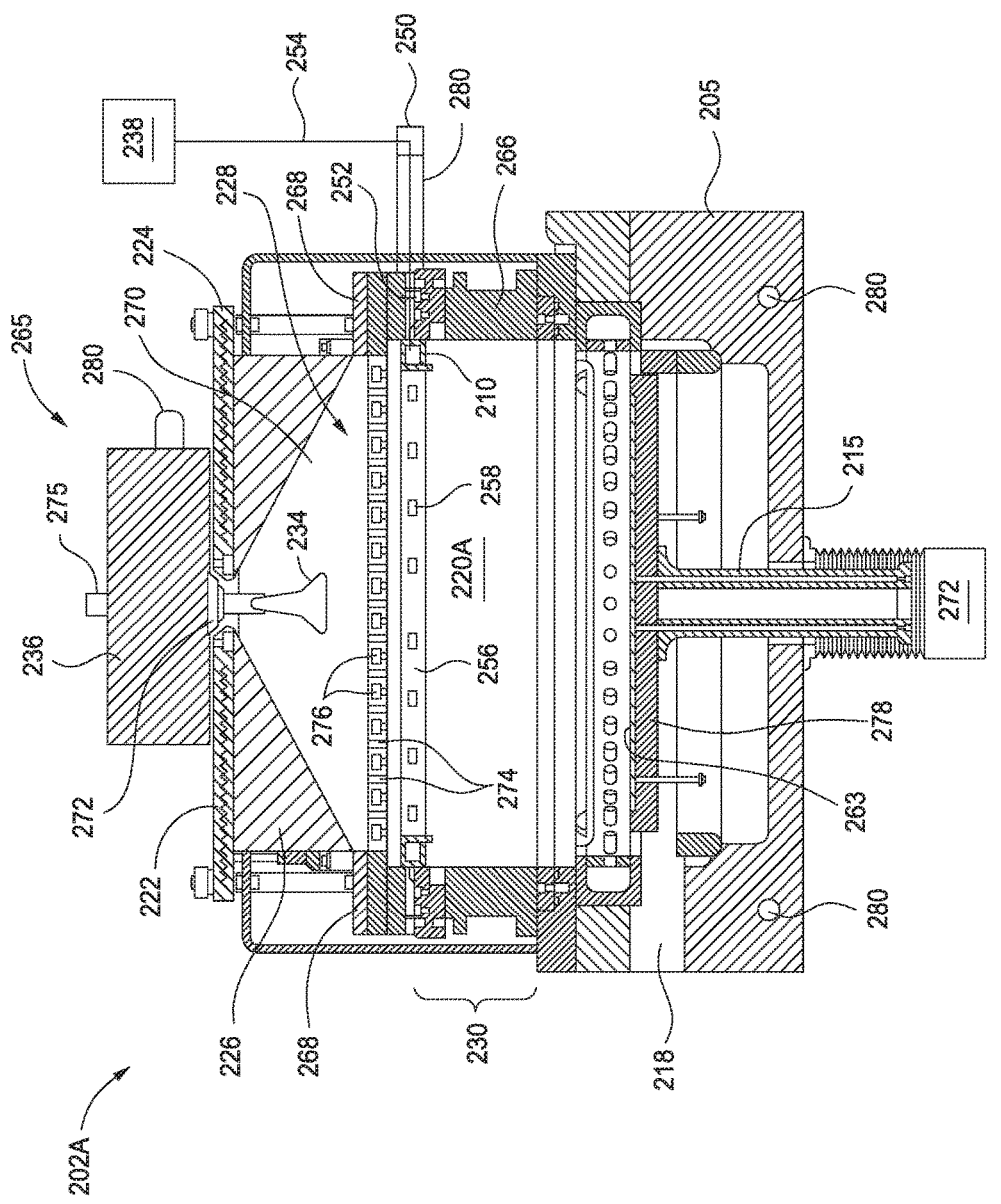
FIG. 2B is an enlarged schematic cross-sectional side view of the processing chamber of FIG. 2A.

FIG. 2B is an enlarged schematic cross-sectional side view of the processing chamber 202A of FIG. 2A. The processing chamber 202A may be any of the processing chambers 108a-108f shown in FIG. 1. The processing chamber 202A may be configured to deposit a flowable film on a substrate 263. The processing chamber 202A includes a lid assembly 264 disposed over a chamber wall 266. The chamber wall 266 may also be a spacer structure of the plasma ring/spacer 230. An insulating ring 268 may be disposed between the lid assembly 264 and the chamber wall 266 for electrically insulating the chamber body 205 from the lid assembly 264.

The first RPS 236 is coupled to the lid assembly 264 and precursor radicals formed in the first RPS 236 are flowed into a plasma region 270 of the processing chamber 202A via a radical inlet manifold 272. A precursor gas inlet 274 is provided on the first RPS 236 for flowing one or more precursor gases into the first RPS 236. The processing chamber 202A further includes the dual channel showerhead 228. The dual channel showerhead 228 includes a first plurality of channels 274 and a second plurality of channels 276. The first plurality of channels 274 and the second plurality of channels 276 are not in fluid communication. During operation, radicals in the plasma region 270 flow into the processing region 220A through the first plurality of channels 274 of the dual channel showerhead 228, and one or more precursor gases flow into the processing region 220A through the second plurality of channels 276. With the dual channel showerhead 228, premature mixing and reaction between the radicals and the precursor gases are avoided.

The plasma distribution ring 256 coupled with the second RPS 238 is disposed between the dual channel showerhead 228 and a substrate support 278 of the pedestal 215. The plasma distribution ring 256 is utilized to deliver cleaning radicals into the processing region 220A from the second RPS 238 coupled to a conduit 254. The plasma distribution ring 256 includes a plurality of openings 258 for delivering cleaning radicals into the processing region 220A.

In some embodiments, manifolds of the first RPS 236 and/or the second RPS 238 have coolant channels 280. The coolant channels 280 may be in fluid communication with a heat exchange fluid that is maintained at about 75 degrees Celsius (i.e., maintained a constant temperature). The cooling of the manifolds may be useful especially during a clean cycle as clean radical generation and recombination as it passes through both manifolds will generate significant heat-load, especially at the lower RPS manifold (e.g., the splitter 250) when the flow splits and changes path/direction of the gas radicals. This cooling is designed to prevent high surface temperature for human safety as well as protect other components of the system.

Clean gas-radicals, after splitting into two equal paths via the lower RPS manifold (e.g., the splitter 250), then enters the plasma distribution ring 256. The plasma distribution ring 256 has an enclosed annulus volume (i.e., internal channel) that acts as a buffer volume and the output of this internal channel to the chamber volume is only through multiple small diameter holes (i.e., openings 258) distributed in the inner diameter of the plasma distribution ring 256. Pressure inside the internal channel of the plasma distribution ring 256 is higher compared to outside the internal channel of the plasma distribution ring 256 (i.e., in the processing region 220A). This may be engineered purposefully so that sufficient pressure drop exist between the internal channel volume of the plasma distribution ring 256 and the chamber volume to ensure flow direction is from the openings 258 to the chamber volume.

The distribution of openings 258 for the plasma distribution ring 256 may be optimized to achieve the most uniform clean etch rate on substrate, without compromising clean etch rate levels. Since F-radicals flow into the plasma distribution ring 256 on one side (e.g., the center side adjacent to the splitter 250), there is a tendency for the F-radicals to distribute unevenly out of the openings 258 of the plasma distribution ring 256. The openings 258 of the plasma distribution ring 256 are optimized geometrically (size and/or distribution) to distribute F-radicals evenly into the processing region 220A. In one embodiment, the number of openings 258 closest to the inlet 252 is less than the number of openings 258 on other portions of the plasma distribution ring 256 spaced away from the inlet 252. In addition, or in the alternative, the openings 258 are spaced further apart at positions near the inlet 252 as opposed to openings 258 on other portions of the plasma distribution ring 256 spaced away from the inlet 252. Additionally or alternatively, the openings 258 closest to the inlet 252 may have a size (e.g., diameter) that is less than a size of openings 258 on other portions of the plasma distribution ring 256 spaced away from the inlet 252. The asymmetric hole distribution of the plasma distribution ring 256 may be optimized by building a numerical model and iterating the distribution and/or geometry of openings 258 therein, and verifying impact on substrate clean etch rate uniformity profile.

Since the precursor gas and precursor radicals mix and react in the processing region below the dual channel showerhead 228, deposition primarily occurs below the dual channel showerhead 228 except some minor back diffusion. Thus, the components of the processing chamber 202A disposed below the dual channel showerhead 228 should be cleaned periodically after processing.

During a deposition cycle in the conventional systems, where a RPS device is shared by more than one of the processing regions and is used for both deposition gases and cleaning gases, the RPS is used to disassociate Ar, $NH_3$ & $O_2$ into H, $H_2$, NH, $NH_2$, and/or O radicals within the shared RPS. In the conventional systems, the radicals are then fed through an aluminum tube into the chamber space (commonly referred to as "lid-stack"). The lid-stack may include a gas-feed-block and baffle to distribute the radicals to a space between the baffle and a showerhead. In one example, the $NH_3$ component radicals will flow through the showerhead and mix with Si and H precursors, such as TSA (trisilylamine), flowing through another channel of the showerhead. Reactions occur on the bottom side of the showerhead in the conventional systems and deposit as particles onto a substrate on a pedestal maintained at a low temp (less than 80 degrees C.) forming a silazane film rich with Si—H bonds. Additionally, in these conventional systems, silazane deposition may occur all over the chamber volume, especially the volume below the showerhead, to and around the walls, as well as the pedestal.

After every deposition cycle in the conventional systems, the same RPS used to disassociate deposition precursors is used in the clean cycle to disassociate Ar, $NF_3$, and $O_2$ ($O_2$ selectively used depending on the clean recipe utilized) to obtain F and O radicals (clean cycle radicals). The clean cycle radicals are flowed through the same flow path as the $NH_3/O_2$ radicals in the deposition cycle. The plasma block used for the shared RPS typically has an $Al_2O_3$ coating (~40 µm thick) on the walls of plasma block on a base material that is aluminum. The coating erodes as it is repeatedly exposed to F-radicals (F will attack the $Al_2O_3$ to form AlF). Erosion may occur at a faster rate at higher temperatures during the "plasma on" cycle of cleaning. The $Al_2O_3$ coating also has pores, as well as fine cracks known as "crazing", and the newly formed AlF builds-up inside the pores and cracks of the coating during each clean cycle. In subsequent deposition cycles, the $NH_3/O_2$ radicals get consumed and/or recombined within the plasma block as AlF build-up increases due to extended usage. This causes a deposition rate/thickness drift problem requiring frequent and expensive RPS replacement.

The AlF formation and build-up due to this reaction of F-radicals with the RPS plasma block also causes particles to be transported out of the RPS and into the chamber volume during clean. In a subsequent deposition cycle, this AlF residue, build-up in the RPS, or other parts of the chamber, comes loose either during a gas stabilization step or during radical flow and is transported onto the substrate causing AlF embedded defects. The severity of the AlF wafer defects increases with more wafer runs/cycles and clean cycles after deposition with $NF_3$. This also causes very frequent replacement of the shared RPS. Since F-radicals during the clean cycle are flowing from the RPS towards the pedestal, there is a significant portion of lid-stack that has no deposition. However, the F-radicals will attack the bare aluminum parts (especially the lid-stack at temperatures of about 130 degrees C.) in the absence of a silazane film for F-radicals to consume, to form AlF. This also adds to the thickness/deposition rate drift issue as $NH_3/O_2$ component radicals get consumed by the AlF residue layer on other upper lid-stack parts which have minimal to no deposition film, just for the F-radicals to travel further downstream to get to the chamber components that actually have deposition and require the F-radicals to clean.

The novel chamber design and method to clean post deposition cycles as described herein solves the thickness/deposition rate drift completely and significantly reduces the AlF formation and build-up. The chamber design and method as disclosed herein adds an additional RPS dedicated to only clean radicals which is shared and used for both sides of a twin flowable CVD chamber (the second RPS 238). Clean gas-radicals are now strategically injected into each of the processing regions 220A, 220B below the dual channel showerhead 228, through the plasma ring/spacer 230 to distribute cleaning species into the chamber space where there is significant deposition. This prevents overcleaning of other portions of the dual channel showerhead 228 which has minimal to no deposition in order to prevent excessive AlF formation. The first RPS 236 coupled to each side of the twin chamber system may be dedicated only to deposition gases/radicals for each side of the twin chamber system.

The method and apparatus as described herein helps to eliminate a fundamental source of the thickness/deposition rate drift. Using the dedicated second RPS 238, radicals of $NH_3/O_2$ are no longer subjected to the F-radicals that erode the $Al_2O_3$ coated aluminum plasma block within the single (shared) RPS (during clean cycle). Also, the pores, cracks/crazing that may be present on surfaces of the plasma block 240 of the first RPS 236 no longer attract AlF residue generated during the clean-cycle, as cleaning plasma no longer runs through the same (shared) RPS as in conventional systems. During the clean cycle, the first RPS 236 may be provided with sufficient argon purge gas flow (which may be optimized via computational fluid dynamics analysis and/or actual coupon clean etch-rate validation). This may be utilized to prevent F-radicals entering the chamber volume via the plasma ring/spacer 230 from diffusing too far upstream from the plasma ring/spacer 230 to the plasma block 240 of the first RPS 236. This may also eliminate damage to the first RPS 236, while also preventing thickness/deposition rate drift and AlF defects.

Finally, in order to clean effectively, the pedestal is rotated during the clean cycle since the critical location of the pedestal (where the substrate sits on the pedestal) has a low temperature of about 65 degrees C., which makes the clean etch rate low. The pedestal may also be rotated during the deposition cycle.

Extensive testing was performed using the embodiments disclosed herein and the results were a stable deposition rate (about −0.15%/1,000 wafers as compared to −2.5%/1,000 wafers (conventional)). AlF defect performance is also orders of magnitude improved according to embodiments disclosed herein (0.05 AlF defects/per pass) compared to conventional design (1.1 AlF defects/per pass). In addition, overall defect performance is significantly improved (sum of all defect types).

While the foregoing is directed to embodiments of the disclosure, other and further embodiments of the disclosure may be devised without departing from the basic scope thereof, and the scope thereof is determined by the claims that follow.

What is claimed is:

1. A twin-chamber deposition system, comprising: a pair of processing chambers; a first remote plasma system in selective fluid communication with a showerhead disposed within each of the processing chambers, the first remote plasma system comprising two remote plasma chambers that are each configured exclusively for a respective one of the pair of processing chambers; and a second remote plasma system in selective fluid communication with each of the pair of processing chambers, wherein the first remote plasma system is configured for deposition precursors and the second remote plasma system is configured for cleaning precursors.

2. The twin-chamber deposition system of claim 1, further comprising a pedestal and a plasma distribution ring in each processing chamber, wherein each plasma distribution ring is positioned between each showerhead and each pedestal, the first remote plasma system delivers radicals to each showerhead, and the second remote plasma system delivers radicals to each plasma distribution ring.

3. The system of claim 2, wherein the plasma distribution ring comprises a plurality of openings formed on an inside diameter thereof.

4. The system of claim 3, wherein openings in the plasma distribution ring include a size that is asymmetrical about the inside diameter thereof.

5. The system of claim 3, wherein a portion of the openings adjacent to an inlet of the plasma distribution ring have a diameter that is less than a diameter of openings spaced-away from the inlet.

6. The system of claim 1, further comprising a valve system that selectively isolates the second remote plasma system from the first remote plasma system.

7. The system of claim 1, further comprising a splitter coupled between the second remote plasma system and the plasma distribution rings in each of the processing chambers.

8. The system of claim 1, further comprising a plurality of conduits disposed between a body of the processing chambers and one or both of the first remote plasma system and the second remote plasma system, wherein the conduits include coolant channels formed therein or thereon.

9. The system of claim 1, wherein the showerhead comprises a dual channel showerhead.

10. A twin chamber system, comprising: a first remote plasma chamber coupled to and configured exclusively for a first processing region of the twin chamber system; a second remote plasma chamber coupled to and configured exclusively for a second processing region of the twin chamber system; and a third remote plasma chamber shared by the first processing region and the second processing region, wherein the first and second remote plasma chambers are configured for deposition precursors and the third remote plasma chamber is configured for cleaning precursors.

11. The system of claim 10, wherein the third remote plasma chamber is in fluid communication with a plasma distribution ring disposed in each of the first and second processing regions.

12. The system of claim 11, wherein the plasma distribution ring comprises a plurality of openings formed on an inside diameter thereof.

13. The system of claim 12, wherein the openings in the plasma distribution ring include a size that is asymmetrical about the inside diameter thereof.

14. The system of claim 12, wherein a portion of the openings adjacent to an inlet of the plasma distribution ring have a diameter that is less than a diameter of openings spaced-away from the inlet.

15. The system of claim 10, further comprising a splitter coupled between the third remote plasma chamber and a plasma distribution ring in each of the processing regions.

16. The system of claim 10, further comprising a plurality of conduits disposed between a body of the twin chamber system and the first, the second and the third remote plasma chambers, wherein the conduits include coolant channels formed therein or thereon.

17. A twin-chamber deposition system, comprising: a pair of processing chambers; a first remote plasma system in selective fluid communication with a showerhead disposed within each of the processing chambers, the first remote plasma system comprising two remote plasma chambers that are configured exclusively for a respective one of the pair of processing chambers; and a second remote plasma system in selective fluid communication with a plasma distribution ring disposed in each of the pair of processing chambers, wherein the first remote plasma system is configured for delivering deposition precursors through the showerhead and the second remote plasma system is configured for delivering cleaning precursors through the respective plasma distribution rings.

18. The system of claim 17, wherein the plasma distribution rings are positioned between a respective showerhead and a respective pedestal within each of the processing chambers.

19. The system of claim 17, further comprising a splitter coupled between the second remote plasma system and the plasma distribution rings in each of the processing chambers.

20. The system of claim 17, wherein the plasma distribution ring comprises a plurality of openings formed on an inside diameter thereof, and a size of the plurality of openings is asymmetrical about the inside diameter thereof.

* * * * *